(12) United States Patent
Galloway

(10) Patent No.: US 11,528,817 B2
(45) Date of Patent: Dec. 13, 2022

(54) PORTABLE POWER SOURCE APPARATUS

(71) Applicant: Don E. Galloway, Willingboro, NJ (US)

(72) Inventor: Don E. Galloway, Willingboro, NJ (US)

(*) Notice: Subject to any disclaimer, the term of this patent is extended or adjusted under 35 U.S.C. 154(b) by 295 days.

(21) Appl. No.: 16/942,990

(22) Filed: Jul. 30, 2020

(65) Prior Publication Data

US 2022/0039271 A1 Feb. 3, 2022

(51) Int. Cl.
```
H05K 5/00      (2006.01)
H02J 7/00      (2006.01)
H01R 13/66     (2006.01)
H02J 9/06      (2006.01)
H05K 5/02      (2006.01)
```

(52) U.S. Cl.
CPC ....... H05K 5/0086 (2013.01); H01R 13/6675 (2013.01); H02J 7/0042 (2013.01); H02J 9/06 (2013.01); H05K 5/0247 (2013.01)

(58) Field of Classification Search
None
See application file for complete search history.

(56) References Cited

U.S. PATENT DOCUMENTS

| | | | |
|---|---|---|---|
| 5,783,927 A | 7/1998 | Chen | |
| 5,982,138 A * | 11/1999 | Krieger | H02J 7/0042 320/105 |
| 7,635,965 B2 | 12/2009 | Hinckson | |
| 7,663,340 B1 | 2/2010 | Neely | |
| D632,649 S | 2/2011 | Scheucher | |
| 8,076,900 B1 * | 12/2011 | Brown | H02J 7/0042 320/105 |
| 8,415,924 B2 * | 4/2013 | Matthias | B25H 3/006 320/114 |
| 9,362,764 B2 | 6/2016 | Farkas | |
| 9,461,488 B2 * | 10/2016 | Shum | H02J 7/0042 |
| 9,681,561 B2 * | 6/2017 | DeSanctis | A45C 13/001 |
| 10,302,259 B2 * | 5/2019 | Heilbrun | F21L 4/08 |
| 10,371,364 B2 * | 8/2019 | Gawthorp | H01M 50/256 |
| 10,424,943 B2 * | 9/2019 | Wang | B65D 25/54 |
| 2001/0043052 A1 * | 11/2001 | Griffey | H02J 7/0042 320/114 |
| 2003/0133319 A1 * | 7/2003 | Radosevich | H02M 7/003 363/141 |

(Continued)

FOREIGN PATENT DOCUMENTS

WO WO2006095353 9/2006

*Primary Examiner* — Xanthia C Cunningham

(57) ABSTRACT

A portable power source apparatus for portable power solutions includes a housing having a housing front side, a housing back side, a housing left side, a housing right side, a housing top side, and a housing bottom side. A primary battery is coupled within the housing. A charging port is coupled to the housing and is in operational communication with the primary battery. A DC inverter is coupled within the housing and is in operational communication with the primary battery. A pair of USB ports is coupled to the housing and is in operational communication with the DC inverter. An AC inverter is coupled within the housing and is in operational communication with the primary battery. A pair of power outlets is coupled to the housing and is in operational communication with the AC inverter.

8 Claims, 5 Drawing Sheets

(56) References Cited

U.S. PATENT DOCUMENTS

| | | | |
|---|---|---|---|
| 2009/0231811 A1* | 9/2009 | Tokuyama | H05K 1/0262 361/699 |
| 2011/0101780 A1 | 5/2011 | Johnson | |
| 2011/0241602 A1 | 10/2011 | Chou | |
| 2012/0025766 A1* | 2/2012 | Reade | H02J 7/0042 320/110 |
| 2013/0164567 A1* | 6/2013 | Olsson | H01M 50/227 429/93 |
| 2013/0183562 A1* | 7/2013 | Workman | H01M 50/502 429/100 |
| 2014/0183107 A1* | 7/2014 | Meunier | H02S 10/40 210/90 |
| 2015/0171632 A1* | 6/2015 | Fry | H02J 7/342 307/22 |
| 2017/0331162 A1* | 11/2017 | Clarke | H02J 7/007192 |
| 2018/0034267 A1* | 2/2018 | Vasefi | H02H 9/02 |
| 2018/0062197 A1* | 3/2018 | Thiel | H05K 5/06 |
| 2018/0366789 A1* | 12/2018 | Petrella | H02J 7/35 |
| 2019/0013686 A1* | 1/2019 | Ma | H02J 7/342 |

* cited by examiner

PORTABLE POWER SOURCE APPARATUS

CROSS-REFERENCE TO RELATED APPLICATIONS

Not Applicable

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC OR AS A TEXT FILE VIA THE OFFICE ELECTRONIC FILING SYSTEM

Not Applicable

STATEMENT REGARDING PRIOR DISCLOSURES BY THE INVENTOR OR JOINT INVENTOR

Not Applicable

BACKGROUND OF THE INVENTION

(1) Field of the Invention

The disclosure relates to power devices and more particularly pertains to a new power device for portable power solutions.

(2) Description of Related Art Including Information Disclosed Under 37 CFR 1.97 and 1.98

The prior art relates to power devices. Existing devices typically serve only direct current or alternating current sources. Most existing devices also only include a single battery and do not have a secondary backup battery. Many known devices also lack a form convenient for travel with a foldable handle.

BRIEF SUMMARY OF THE INVENTION

An embodiment of the disclosure meets the needs presented above by generally comprising a housing having a housing front side, a housing back side, a housing left side, a housing right side, a housing top side, and a housing bottom side. A primary battery is coupled within the housing. A charging port is coupled to the housing and is in operational communication with the primary battery. A DC inverter is coupled within the housing and is in operational communication with the primary battery. A pair of USB ports is coupled to the housing and is in operational communication with the DC inverter. An AC inverter is coupled within the housing and is in operational communication with the primary battery. A pair of power outlets is coupled to the housing and is in operational communication with the AC inverter.

There has thus been outlined, rather broadly, the more important features of the disclosure in order that the detailed description thereof that follows may be better understood, and in order that the present contribution to the art may be better appreciated. There are additional features of the disclosure that will be described hereinafter and which will form the subject matter of the claims appended hereto.

The objects of the disclosure, along with the various features of novelty which characterize the disclosure, are pointed out with particularity in the claims annexed to and forming a part of this disclosure.

BRIEF DESCRIPTION OF SEVERAL VIEWS OF THE DRAWING(S)

The disclosure will be better understood and objects other than those set forth above will become apparent when consideration is given to the following detailed description thereof. Such description makes reference to the annexed drawings wherein.

DETAILED DESCRIPTION OF THE INVENTION

Figure 1:
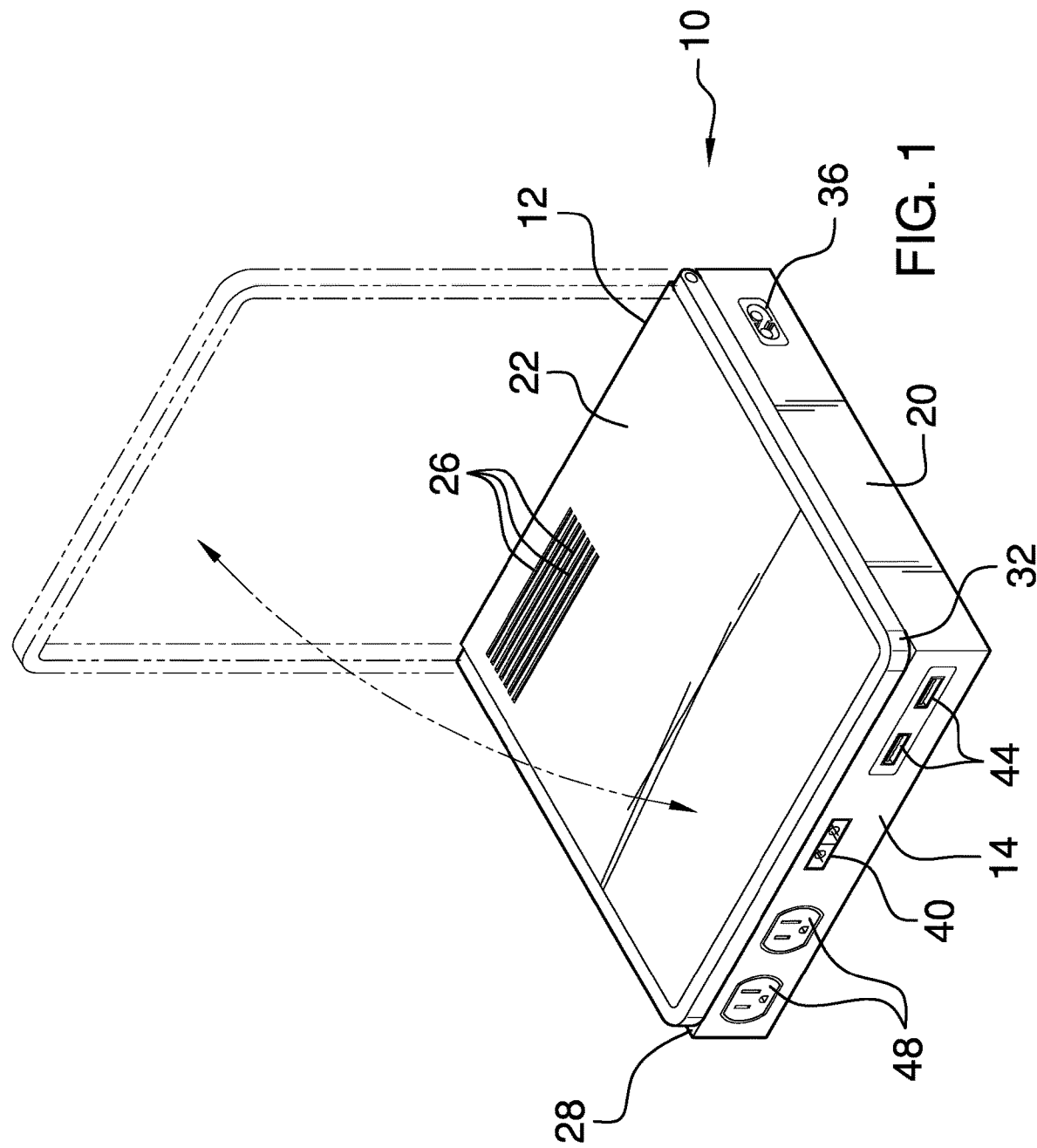
FIG. 1 is an isometric view of a portable power source apparatus according to an embodiment of the disclosure.
Figure 2:
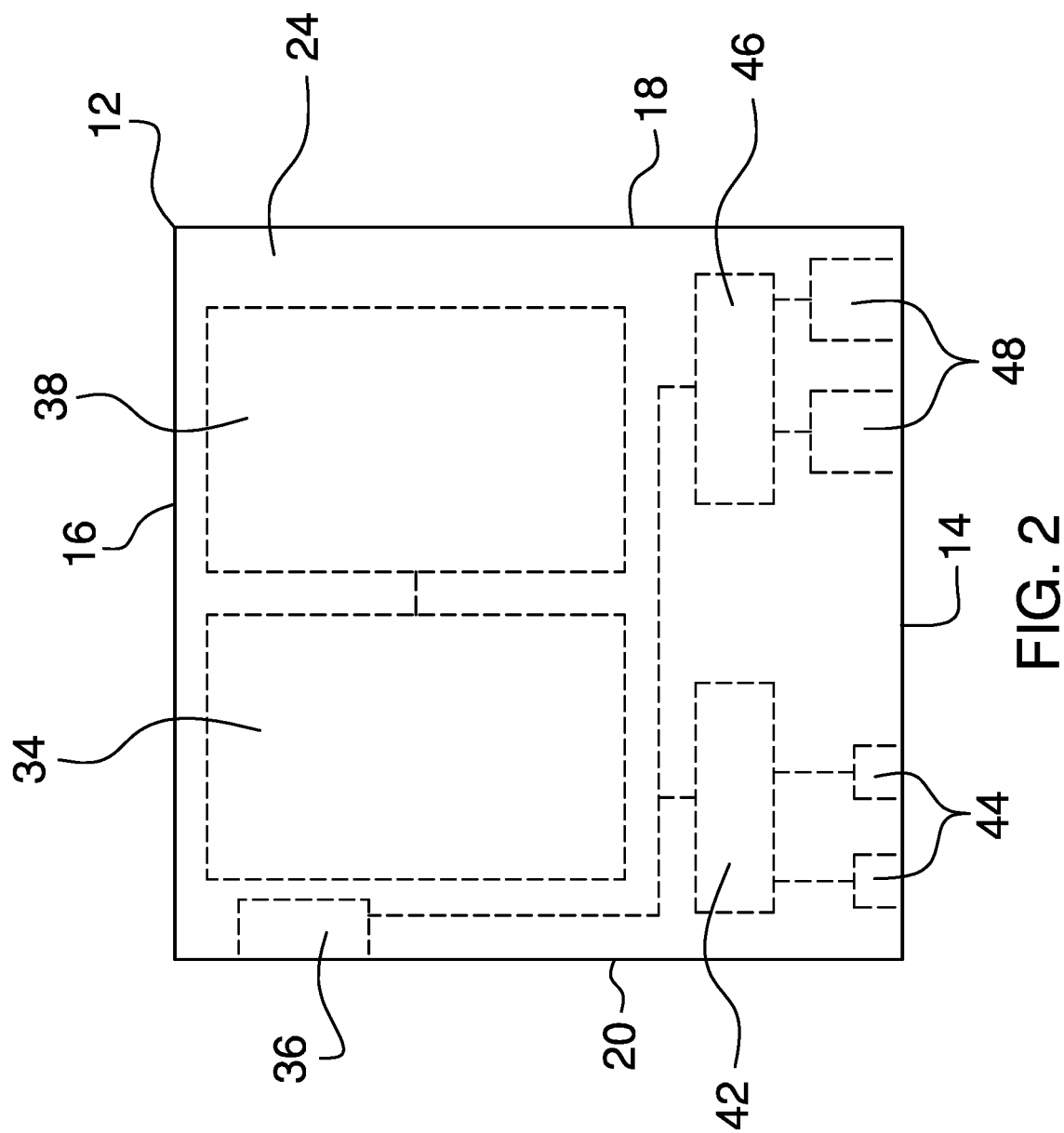
FIG. 2 is a bottom plan view of an embodiment of the disclosure.
Figure 3:
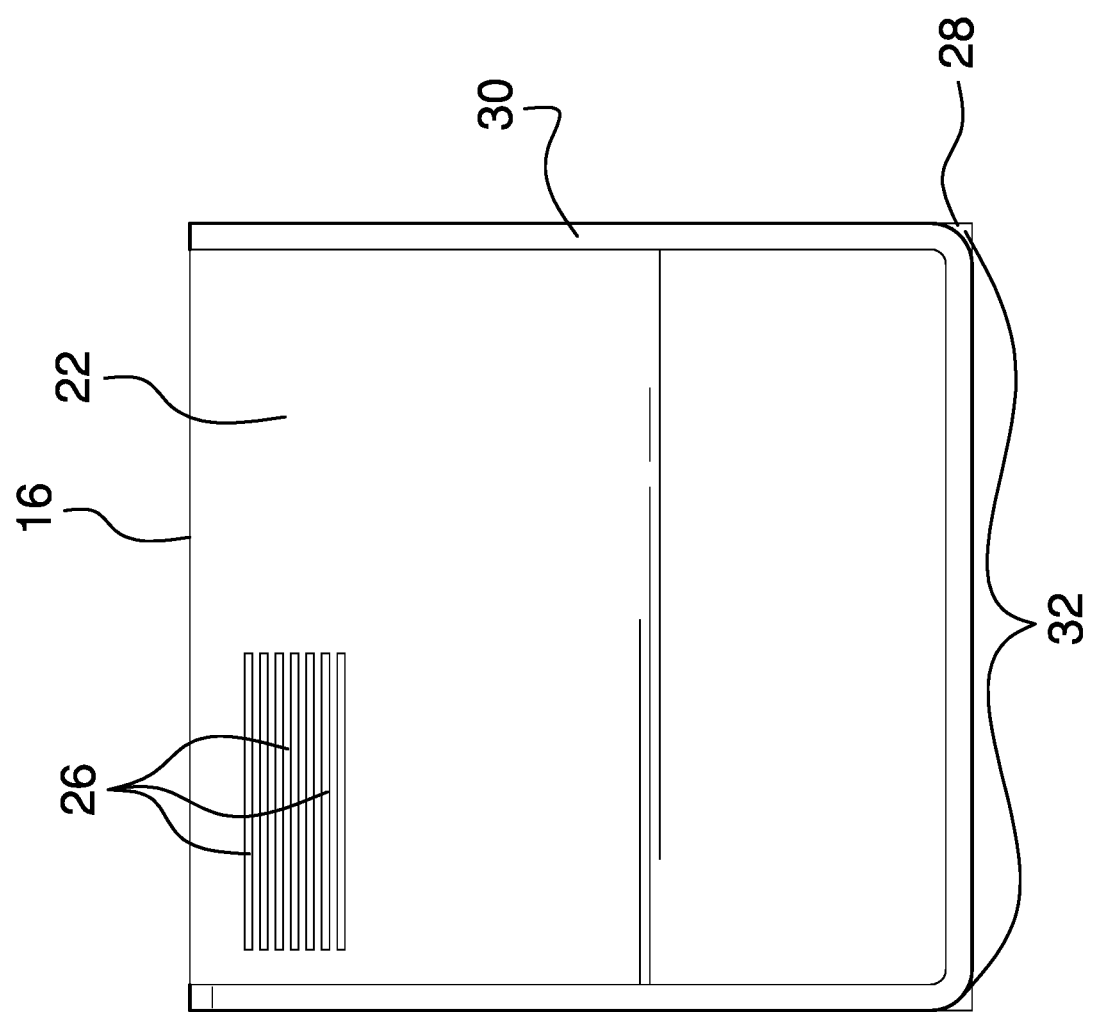
FIG. 3 is a top plan view of an embodiment of the disclosure.
Figure 4:
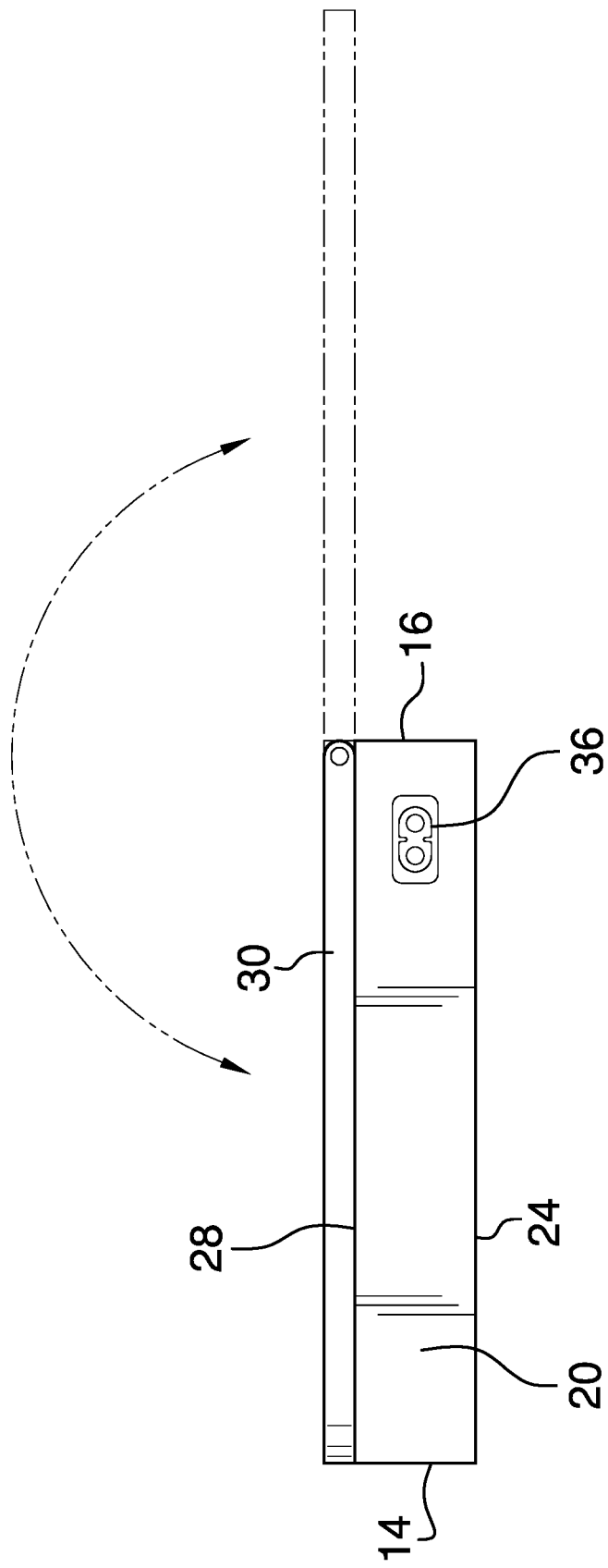
FIG. 4 is a side elevation view of an embodiment of the disclosure.
Figure 5:
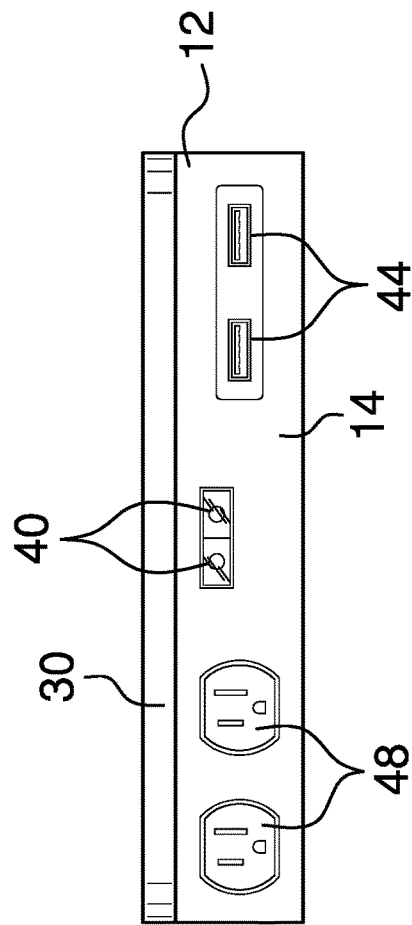
FIG. 5 is a front elevation view of an embodiment of the disclosure.
Figure 6:
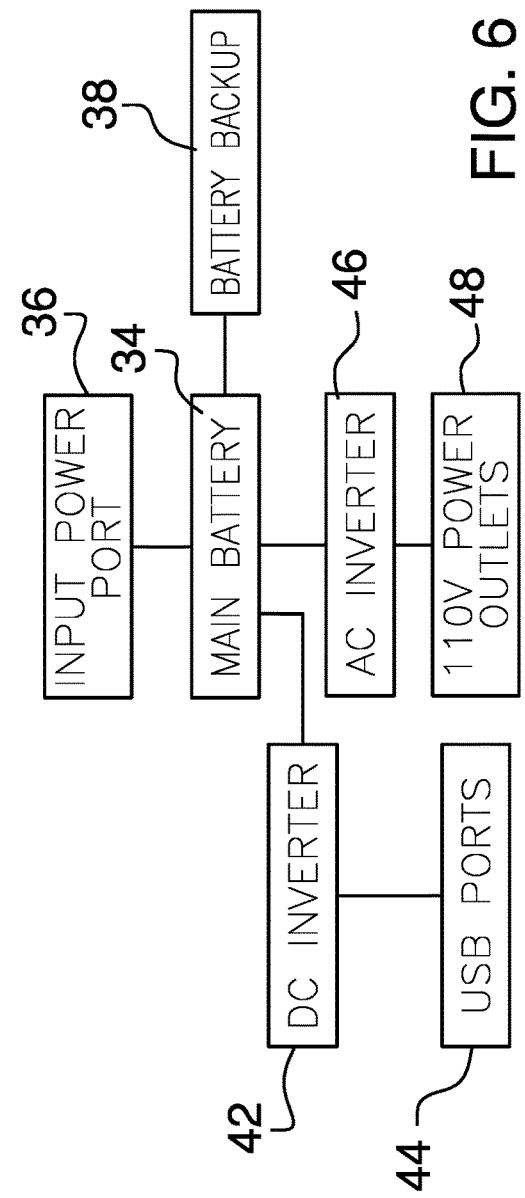
FIG. 6 is a block diagram of an embodiment of the disclosure.

With reference now to the drawings, and in particular to FIGS. 1 through 6 thereof, a new power device embodying the principles and concepts of an embodiment of the disclosure and generally designated by the reference numeral 10 will be described.

As best illustrated in FIGS. 1 through 6, the portable power source apparatus 10 generally comprises a housing 12 having a housing front side 14, a housing back side 16, a housing left side 18, a housing right side 20, a housing top side 22, and a housing bottom side 24. The housing top side 22 may have a plurality of vent apertures 26 extending therethrough. The housing top side 22 may have a recessed border 28 extending along the housing left side 18, the housing front side 14, and the housing right side 20.

A handle 30 is pivotably coupled to the housing 12. The handle 30 conforms to the recessed border 28 and pivots between a folded position within the recessed border 28 and a carry position. The handle 30 may have a pair of rounded corners 32. A primary battery 34 is coupled within the housing 12. A charging port 36 is coupled to the housing 12. The charging port 36 may extend through the housing right side 20 and is in operational communication with the primary battery 34. A secondary battery 38 may be coupled with the housing 12. The secondary battery 38 is in operational communication with the primary battery 34 and the charging port 36 to be charged once the primary battery 34 has charged. When the primary battery 34 has been depleted it may draw power from the secondary battery 38.

A pair of light indicators 40 may be coupled to the housing 12. The pair of light indicators 40 may be coupled to the housing front side 14 and is in operational communication with the primary battery 34 and the secondary battery 38. The pair of light indicators 40 may indicate the charge level of the primary battery 34 and the secondary battery 38 and may indicate which is currently in use.

A DC inverter 42 is coupled within the housing 12 and is in operational communication with the primary battery 34. A pair of USB ports 44 is coupled to the housing 12 and is in operational communication with the DC inverter 42. The pair of USB ports 44 may be coupled through the housing front side 14 and configured to receive a standard USB power cord.

An AC inverter 46 is coupled within the housing 12 and is in operational communication with the primary battery 34. A pair of power outlets 48 is coupled to the housing 12 and is in operational communication with the AC inverter 46. The pair of power outlets 48 may be coupled through the housing front side 14. The pair of power outlets 48 The pair of light indicators 40 may be medially positioned on the housing front side 14 between the pair of USB ports 44 and the pair of power outlets 48.

In use, a charging cable is connected to the charging port 36 to charge the primary battery 34 and the secondary battery 38. Once disconnected the apparatus 10 may be carried by the handle 30. Devices with standard plugs requiring alternating current are connected to the pair of power outlets 48 and devices with USB plugs requiring direct current are connected to the pair of USB ports 44.

With respect to the above description then, it is to be realized that the optimum dimensional relationships for the parts of an embodiment enabled by the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by an embodiment of the disclosure.

Therefore, the foregoing is considered as illustrative only of the principles of the disclosure. Further, since numerous modifications and changes will readily occur to those skilled in the art, it is not desired to limit the disclosure to the exact construction and operation shown and described, and accordingly, all suitable modifications and equivalents may be resorted to, falling within the scope of the disclosure. In this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be only one of the elements.

I claim:

1. A portable power source apparatus comprising:
   a housing having a housing front side, a housing back side, a housing left side, a housing right side, a housing top side, and a housing bottom side defining a housing inside;
   a primary battery coupled within the housing;
   a charging port coupled to the housing, the charging port being in operational communication with the primary battery;
   a DC inverter coupled within the housing, the DC inverter being in operational communication with the primary battery;
   a pair of USB ports coupled to the housing, the pair of USB ports being in operational communication with the DC inverter;
   an AC inverter coupled within the housing, the AC inverter being in operational communication with the primary battery; and
   a pair of power outlets coupled to the housing, the pair of power outlets being in operational communication with the AC inverter;
   a secondary battery coupled with the housing, the secondary battery being in operational communication with the primary battery and the charging port; and
   a pair of light indicators coupled to the housing, the pair of light indicators being in operational communication with the primary battery and the secondary battery.

2. The portable power source apparatus of claim 1 further comprising the housing top side having a plurality of vent apertures extending through to the housing inside.

3. The portable power source apparatus of claim 1 further comprising a handle pivotably coupled to the housing.

4. The portable power source apparatus of claim 3 further comprising the housing top side having a recessed border; the handle conforming to the recessed border and pivoting between a folded position within the recessed border and a carry position.

5. The portable power source apparatus of claim 4 further comprising the handle having a pair of rounded corners.

6. The portable power source apparatus of claim 1 further comprising the pair of light indicators being coupled to the housing front side.

7. The portable power source apparatus of claim 1 further comprising the pair of USB ports and the pair of power outlets being coupled through the housing front side.

8. A portable power source apparatus comprising:
   a housing having a housing front side, a housing back side, a housing left side, a housing right side, a housing top side, and a housing bottom side defining a housing inside, the housing top side having a plurality of vent apertures extending through to the housing inside, the housing top side having a recessed border;
   a handle pivotably coupled to the housing, the handle conforming to the recessed border and pivoting between a folded position within the recessed border and a carry position, the handle having a pair of rounded corners;
   a primary battery coupled within the housing;
   a charging port coupled to the housing, the charging port being in operational communication with the primary battery;
   a secondary battery coupled with the housing, the secondary battery being in operational communication with the primary battery and the charging port;
   a pair of light indicators coupled to the housing, the pair of light indicators being coupled to the housing front side, the pair of light indicators being in operational communication with the primary battery and the secondary battery;
   a DC inverter coupled within the housing, the DC inverter being in operational communication with the primary battery;
   a pair of USB ports coupled to the housing, the pair of USB ports being coupled through the housing front side and being in operational communication with the DC inverter;
   an AC inverter coupled within the housing, the AC inverter being in operational communication with the primary battery; and a pair of power outlets coupled to the housing, the pair of power outlets being coupled through the housing front side and being in operational communication with the AC inverter.

\* \* \* \* \*